United States Patent
Miya

(10) Patent No.: US 7,767,026 B2
(45) Date of Patent: Aug. 3, 2010

(54) SUBSTRATE PROCESSING APPARATUS AND SUBSTRATE PROCESSING METHOD

(75) Inventor: Katsuhiko Miya, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1068 days.

(21) Appl. No.: 11/397,814

(22) Filed: Mar. 27, 2006

(65) Prior Publication Data

US 2006/0219264 A1 Oct. 5, 2006

(30) Foreign Application Priority Data

Mar. 29, 2005 (JP) ............................. 2005-094744
Mar. 29, 2005 (JP) ............................. 2005-094745

(51) Int. Cl.
B08B 3/04 (2006.01)

(52) U.S. Cl. ........................... 134/21; 134/26

(58) Field of Classification Search ........................... None
See application file for complete search history.

(56) References Cited

U.S. PATENT DOCUMENTS 5,913,981 A * 6/1999 Florez ............................. 134/3
2004/0187891 A1* 9/2004 Chou et al. ..................... 134/1

FOREIGN PATENT DOCUMENTS

| JP | 8-31745 | 2/1996 |
| JP | 11-87292 | 3/1999 |
| JP | 2003-309102 | 10/2003 |
| JP | 2004-363292 | 12/2004 |
| JP | 2005-203599 | 7/2005 |

OTHER PUBLICATIONS

Computer Translation of JP 2003-309102 by Orii, published Oct. 31, 2003.*
Notice of Allowance issued on Jan. 19, 2010 in connection with corresponding Japanese Application No. 2005-094744 (JP2003-309102 was previously submitted in an Information Disclosure Statement filed Jul. 10, 2006 and is therefore not enclosed.).
Office Action issued on Jan. 19, 2010 in connection with corresponding Japanese Application No. 2005-094745 (JP2003-309102 was previously submitted in an Information Disclosure Statement filed Jul. 10, 2006 and is therefore not enclosed.).

* cited by examiner

Primary Examiner—Michael Kornakov
Assistant Examiner—Ryan Coleman
(74) Attorney, Agent, or Firm—Ostrolenk Faber LLP

(57) ABSTRACT

An on-off valve 81 is opened during rinsing, whereby a part of DIW supplied to a processing liquid supply section 43 is guided into inside a suction pipe 82. After rinsing, a puddle is formed between a lower cleaning nozzle 29 and the bottom surface of a wafer. As the on-off valve 81 is opened while an on-off valve 86 is kept close, the puddle is sucked at a first speed (V1) which is regulated by a needle valve 85 and set to a relatively slow speed. Once the puddle is collected into inside the lower cleaning nozzle 29, the on-off valve 86 is opened so that the puddle is sucked at a second speed (V2) which is regulated by a needle valve 84 and which is faster than said first speed.

11 Claims, 9 Drawing Sheets

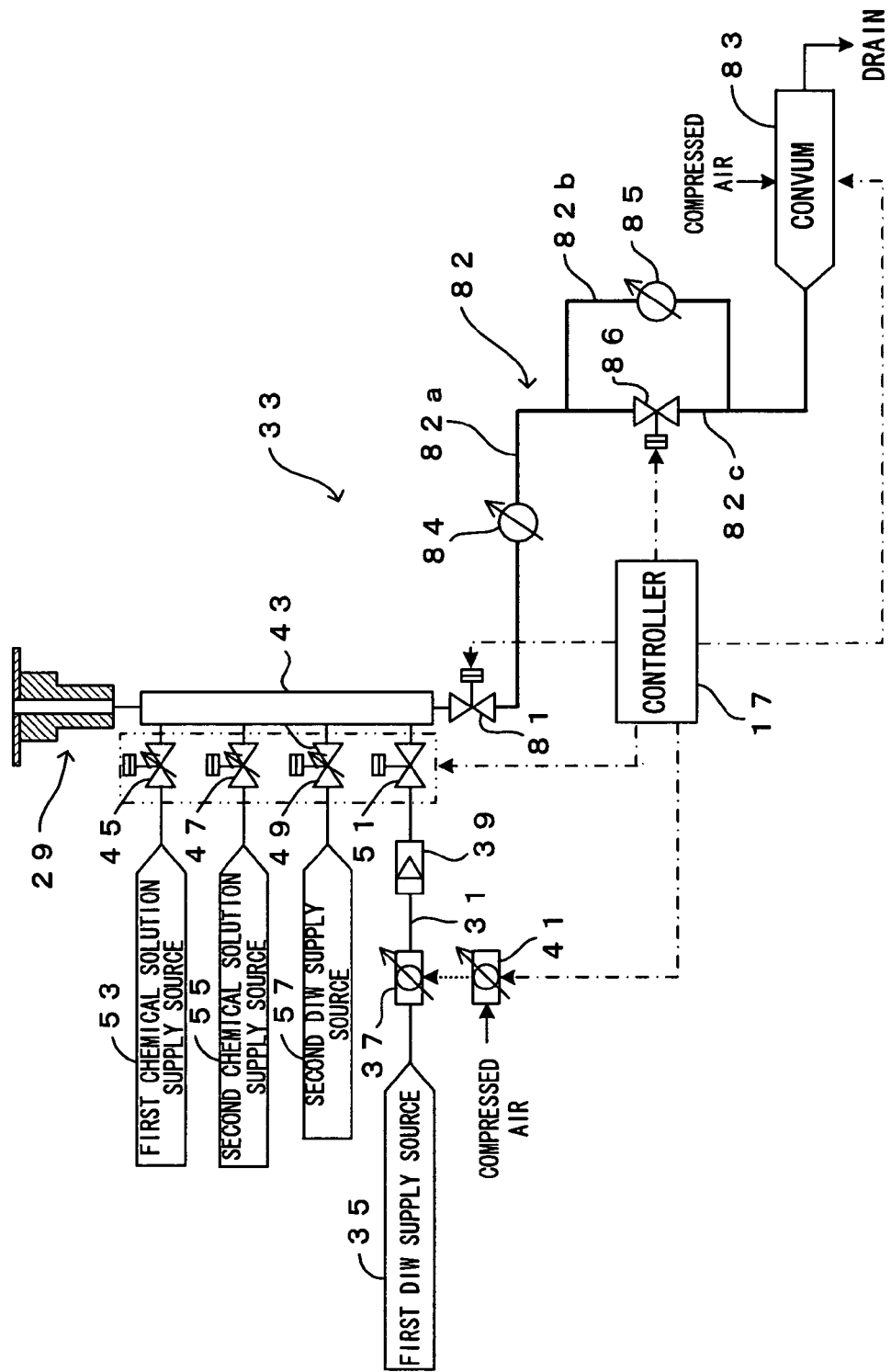

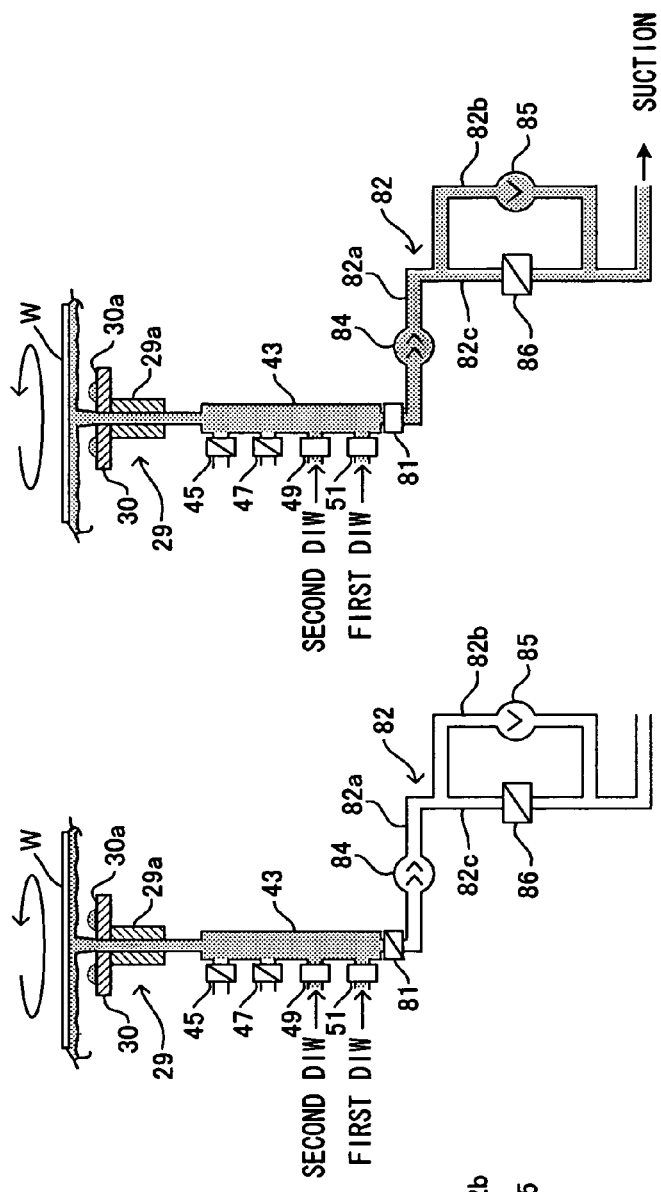

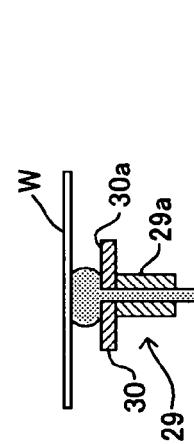
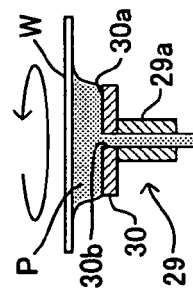
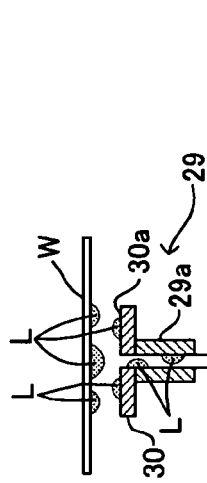
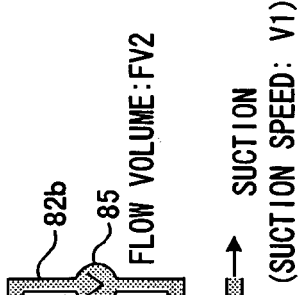

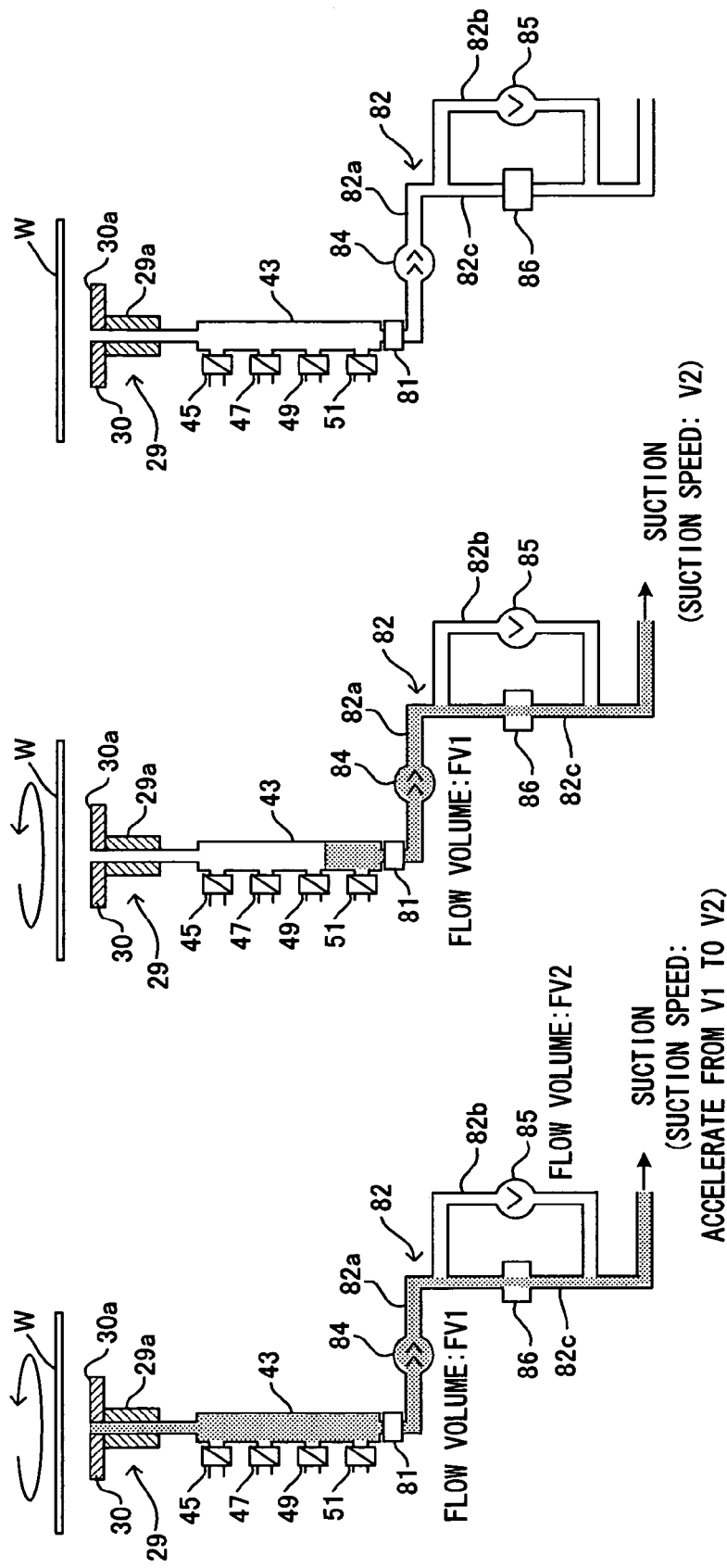

SUBSTRATE PROCESSING APPARATUS AND SUBSTRATE PROCESSING METHOD

CROSS REFERENCE TO RELATED APPLICATION

The disclosure of Japanese Patent Applications enumerated below including specification, drawings and claims is incorporated herein by reference in its entirety:
No. 2005-094744 filed Mar. 29, 2005; and
No. 2005-094745 filed Mar. 29, 2005.

BACKGROUND OF THE INVENTION

1. Field of the Invention

The present invention relates to a substrate processing apparatus for and a substrate processing method of performing processing, such as cleaning, of various types of substrates such as semiconductor wafers, glass substrates for photomask, glass substrates for liquid crystal display, glass substrates for plasma display and optical disk substrates while supplying a processing liquid to the substrates.

2. Description of the Related Art

As a conventional substrate apparatus of this type, such a substrate processing apparatus is known which comprises a rotate/hold member which rotates a wafer, a type of a substrate, which is held at its rim region by holders which may be holder pins and a nozzle which supplies a processing liquid such as a chemical solution and pure water at a predetermined flow volume toward the bottom surface (back surface) of the wafer. In the substrate processing apparatus described in Japanese Patent Application Unexamined Publication No. 2003-309102 for example, the bottom surface of a wafer is rinsed as a nozzle supplies a processing liquid (rinsing liquid) to a central region of the bottom surface of the wafer while rotating a rotate/hold member by a motor or the like with the wafer held. The nozzle is connected with a suction apparatus which may be an aspirator, a vacuum pump or the like via on-off valves, and as the suction apparatus operates and the on-off valve (suction valve) is opened after rinsing, drops of the processing liquid adhering to the inside of the nozzle and the on-off valve (processing liquid supply valve) which is inserted between the nozzle and a processing liquid supplying source are sucked and removed. Nitrogen gas is then blown against the bottom surface of the wafer via the nozzle while rotating the wafer at a predetermined number of revolution, thereby drying the wafer. This prevents generation of mist of the processing liquid inside the nozzle at the time of gas ejection and obviates formation of a watermark.

SUMMARY OF THE INVENTION

By the way, when the suction apparatus sucks drops of the processing liquid adhering to the nozzle and the processing liquid supply valve (supplier) connected with the nozzle, the following troubles may occur depending upon the speed of sucking drops.

When the speed of sucking drops of the processing liquid is too fast, many drops will remain inside the nozzle and the processing liquid supply valve. Immediately after the start of suction in particular, suction progresses while the processing liquid remains adhering to the nozzle and the processing liquid supply valve, and therefore, there is a large amount of thus sucked drops of the processing liquid and drops tend to remain inside the nozzle and the processing liquid supply valve. Drops of the processing liquid (rinsing liquid) if any remaining the nozzle and the processing liquid supply valve will be discharged together with a chemical solution, at the start of chemical processing. In consequence, despite the demand to collection of the chemical solution alone and a reduced running cost, it is not possible to collect only the chemical solution, which decreases the rate of chemical solution collection. Further, the residual drops adhering to the nozzle and a surrounding area will cause a watermark, adhesion of a particle to the wafer, etc.

While a solution to this may be for instance to dispose a flow volume regulating valve such as a needle valve between the suction valve and the suction apparatus, adjust the flow volume of a fluid which flows through the flow volume regulating valve and set the speed of sucking drops of the processing liquid adhering to the nozzle and the processing liquid supply valve to a relatively slow speed, it is difficult to stabilize the speed of sucking drops of the processing liquid at a slow speed for the following reason. That is, prior to the start of suction, there is a gas (air) within a pipe located in the suction apparatus side relative to the suction valve, because of the previous sucking operation. When the sucking operation is started in this state, i.e., the suction apparatus operates with the suction valve open, the gas within the pipe located in the suction apparatus side relative to the suction valve is compressed and the volume of the gas changes. This causes rapid suction of drops adhering to the inside the nozzle and the processing liquid supply valve.

Further, a needle portion (fluid passing portion) of the needle valve is narrow in an attempt to restrict the flow volume of a fluid which passes, and if a mixture of a gas and a liquid (drops) passes through the needle portion, the drops sucking speed varies and stable suction becomes impossible. Describing in more specific details, the drops sucking speed becomes faster when a gas passes through the needle portion, whereas when a liquid passes through the needle portion, the drops sucking speed becomes slower and therefore the drops sucking speed is not stable. In other words, it becomes impossible to ensure that the speed of sucking drops of the processing liquid adhering to the insides of the nozzle and the processing liquid supply valve will stay at a stable and slow speed during an initial suction stage.

As a result, many drops remain within the nozzle and the processing liquid supply valve (supplier), whereby the collection rate of chemical solution decreases and drops remaining at the nozzle and a surrounding area generate a defect such as a watermark and adhesion of a particle to a wafer. However, the conventional apparatus provides no consideration upon the speed of sucking drops during the initial suction stage.

In the meantime, when the speed of sucking drops of the processing liquid is too slow, the time required for suction becomes longer and the throughput of the apparatus deteriorates tremendously. To be noted in particular, the conventional apparatus can not dry a wafer due to the problem of mist generation until suction of drops completes, and therefore, a slow drops sucking speed seriously affects the throughput of the apparatus. Despite this, the conventional apparatus provides no consideration upon the speed at which the suction apparatus sucks drops of the processing liquid.

A first object of the invention is to provide a substrate processing apparatus for and a substrate processing method of stabilizing the speed of sucking drops of a processing liquid adhering to a nozzle and a supplier connected with the nozzle during an initial suction stage.

A second object of the invention is to provide a substrate processing apparatus and a substrate processing method with which it is possible to improve the throughput of the apparatus while securely removing a processing liquid adhering to a nozzle and a supplier connected with the nozzle.

The invention is directed to a method of and an apparatus for processing a substrate while supplying a processing liquid to the substrate. In a first aspect of the invention, to achieve the first object above, a first processing liquid is supplied to a nozzle via a supplier connected with the nozzle, whereby a substrate is rinsed with the first processing liquid. Following this, along a suction channel whose one end is connected with the supplier, drops of the first processing liquid adhering to the nozzle and the supplier are sucked and the drops of the first processing liquid are removed off from the nozzle and the supplier. The first processing liquid is supplied to the suction channel via the supplier during execution of this rinsing, thereby filling the suction channel with the first processing liquid.

In a second aspect of the invention, to achieve the first object above, while rotating a substrate, a first processing liquid is supplied to a nozzle which is disposed away from the bottom surface of the substrate via a supplier which is connected with the nozzle, whereby the first processing liquid is supplied to the entire bottom surface of the substrate. A second processing liquid is thereafter supplied to the nozzle via the supplier, the second processing liquid is discharged toward the bottom surface of the substrate from a top end portion of the nozzle, a puddle is formed between a central region of the bottom surface of the substrate and the top end portion of the nozzle. Following this, along a suction channel whose one end is connected with the supplier, the puddle is sucked from the top end portion of the nozzle and removed from between the central region of the bottom surface of the substrate and the top end portion of the nozzle. Prior to the sucking operation of sucking the puddle, either one of the first processing liquid and the second processing liquid is supplied to the suction channel via the supplier and the suction channel is filled with this processing liquid.

In a third aspect of the invention, to achieve the second object above, a first processing liquid is supplied to a nozzle via a supplier which is connected with the nozzle, whereby the substrate is rinsed with the first processing liquid. Following this, along a suction channel whose one end is connected with the supplier, drops of the first processing liquid adhering to the nozzle and the supplier are sucked and the drops of the first processing liquid are removed off from the nozzle and the supplier. At this moment, drops of the first processing liquid are sucked while accelerating the speed of sucking the drops of the first processing liquid over at least two stages from a first speed to a second speed which is faster than the first speed.

In a fourth aspect of the invention, to achieve the second object above, while rotating the substrate, a first processing liquid is supplied to a nozzle which is disposed away from the bottom surface of the substrate via a supplier which is connected with the nozzle, whereby the first processing liquid is supplied to the entire bottom surface of the substrate. The second processing liquid is thereafter supplied to the nozzle via the supplier, the second processing liquid is discharged toward the bottom surface of the substrate from the top end portion of the nozzle, a puddle is formed between a central region of the bottom surface of the substrate and the top end portion of the nozzle. Following this, along a suction channel whose one end is connected with the supplier, the puddle is sucked from the top end portion of the nozzle and removed from between the central region of the bottom surface of the substrate and the top end portion of the nozzle. During this, the puddle is sucked while accelerating the speed of sucking the puddle over at least two stages from a first speed to a second speed which is faster than the first speed.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 3 is a block diagram which schematically shows the structure of a feed/suction mechanism;

FIGS. 5A through 5C are drawings which schematically show the operation of the substrate processing apparatus which is shown in FIG. 1;

FIGS. 6A through 6C are drawings which schematically show the operation of the substrate processing apparatus which is shown in FIG. 1;

FIGS. 7A through 7C are drawings which schematically show the operation of the substrate processing apparatus which is shown in FIG. 1;

DETAILED DESCRIPTION OF THE PREFERRED EMBODIMENTS

Figure 1:
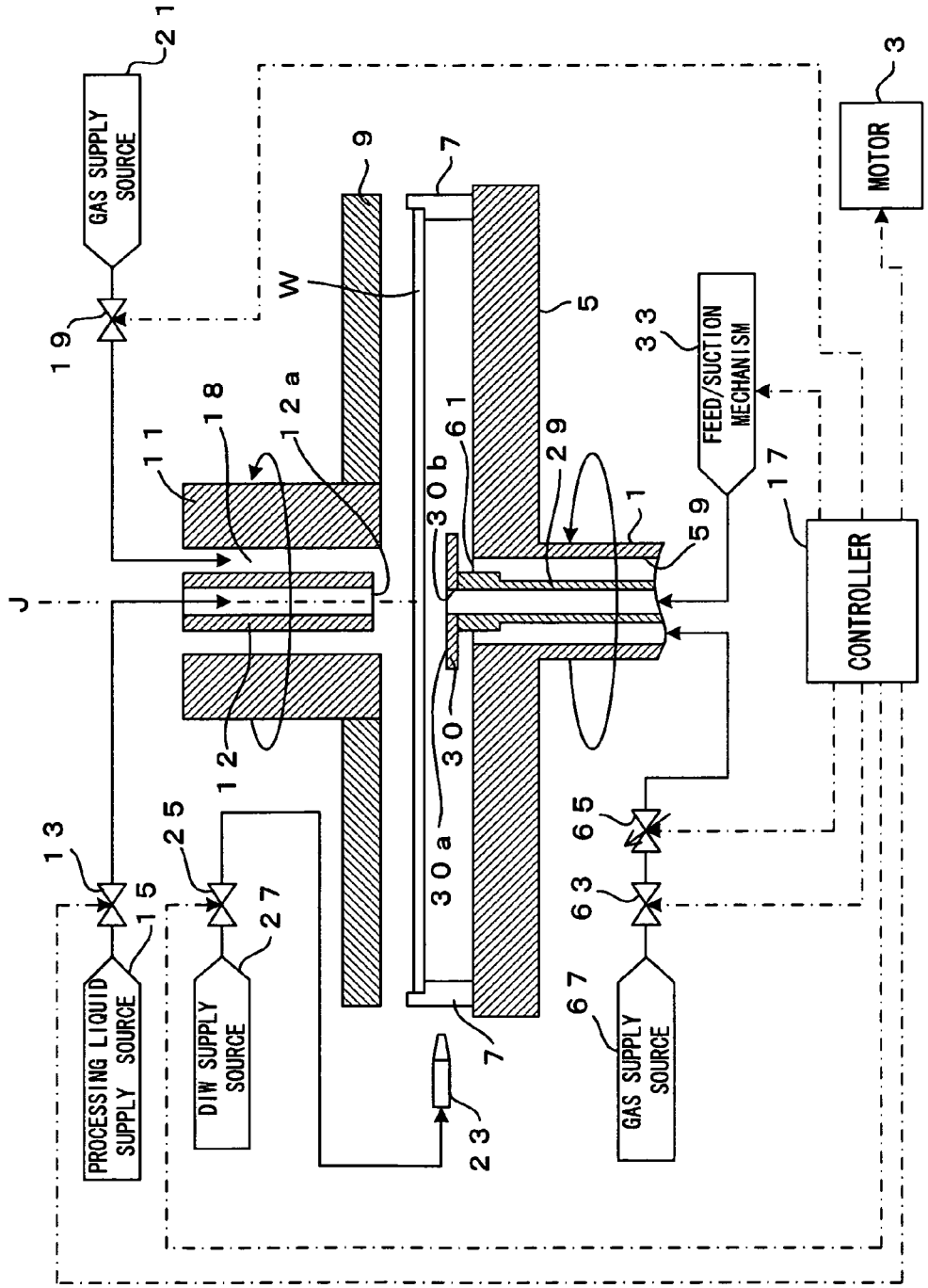
FIG. 1 is a drawing of a substrate processing apparatus according to an embodiment of the invention.

FIG. 1 is a drawing of a substrate processing apparatus according to an embodiment of the invention. This substrate processing apparatus is an apparatus which supplies a chemical solution to the top surface and the bottom surface of a semiconductor wafer (hereinafter referred to simply as a "wafer") which is one type of the "substrate" of the invention, thereby performing chemical processing such as etching, and which spins and dries the wafer after rinsing with a rinsing liquid which may be pure water or DIW (=deionized water) following chemical processing. In this substrate processing apparatus, a hollow rotation shaft 1 is linked with a rotation shaft of a motor 3 and rotates about a vertical axis J when driven by the motor 3. A disk-shaped spin base 5 is integrated and linked with an upper end portion of the rotation shaft 1 by a fastening component such as a screw. Meanwhile, in the vicinity of a rim region of the spin base 5, there are plural support pins 7 which support the wafer W while abutting on an outer edge portion of the wafer W. The wafer W is supported horizontally as it is spaced apart by the plural support pins 7 over a predetermined distance from the spin base 5 which is opposed against the bottom surface of the wafer W. In this embodiment, the spin base 5 and the plural support pins 7 thus form a substrate supporter which supports the wafer (substrate) W.

An atmosphere blocking member 9 having an opening at its center is disposed above the spin base 5. The atmosphere blocking member 9 is slightly larger than the diameter of the wafer W and attached to a lower end portion of a support shaft 11 which is hollow and cylindrical in such a manner that the atmosphere blocking member 9 can rotate together with the support shaft 11 as one integrated unit. Linked with the support shaft 11 is a block drive mechanism not shown, and when a motor of the block drive mechanism drives, the atmosphere blocking member 9 rotates together with the support shaft 11 about the vertical axis J. Further, as an elevating actuator (which may be an air cylinder for instance) of the block drive mechanism is activated, the atmosphere blocking member 9 moves closer to the spin base 5 or away from the spin base 5.

An upper cleaning nozzle 12 is coaxially disposed in the hollow portion of the support shaft 11, which makes it possible to supply, from a nozzle opening 12a at a lower end portion of the upper cleaning nozzle 12, a processing liquid such as a chemical solution and pure water (a chemical solution and a rinsing liquid) to the center of rotation and a surrounding area of the top surface of the wafer W which is supported at the support pins 7. That is, the upper cleaning nozzle 12 is linked with a processing liquid supply source 15 via an on-off valve 13, and as the on-off valve 13 opens and closes under the control of a controller 17 which controls the apparatus as a whole, a chemical solution, a rinsing liquid (pure water, DIW, etc.) is supplied to the top surface of the wafer W from the upper cleaning nozzle 12.

The gap between an inner wall surface of the hollow portion of the support shaft 11 and an outer wall surface of the upper cleaning nozzle 12 is a gas supply path 18. The gas supply path 18 links to a gas supply source 21 via an on-off valve 19. After chemical processing and rinsing using the upper cleaning nozzle 12, as the on-off valve 19 opens and closes under the control of the controller 17, a gas such as nitrogen gas is supplied to the top surface of the wafer W via the gas supply path 18, which dries the wafer W.

On the side of the spin base 5, a side cleaning nozzle 23 is disposed which supplies DIW between the atmosphere blocking member 9 and the top surface of the wafer W and between the top surface of the spin base 5 and the bottom surface of the wafer W. The side cleaning nozzle 23 links with a DIW supply source 27 via an on-off valve 25. A top-to-bottom elevating mechanism (not shown) is linked with the side cleaning nozzle 23, which permits aligning this nozzle 23 along the vertical direction in accordance with a control command from the controller 17. Adjustment of the timing of opening and closing the on-off valve 25 while controlling the height of the side cleaning nozzle 23 by means of the controller 17 realizes supply of DIW from the side cleaning nozzle 23 to the bottom surface of the atmosphere blocking member 9 through the space between the atmosphere blocking member 9 and the top surface of the wafer W and to an opposed surface of the spin base 5 through the space between the opposed surface of the spin base 5 and the bottom surface of the wafer W.

A lower cleaning nozzle 29 which corresponds to the "nozzle" of the invention is coaxially disposed in the hollow portion of the rotation shaft 1. A feed/suction mechanism 33 is connected with the lower cleaning nozzle 29. A cylindrical gas supply path 59 is formed in the gap between an inner wall surface of the rotation shaft 1 and an outer wall surface of the lower cleaning nozzle 29. A top end portion of the gas supply path 59 functions as a gas discharge outlet 61, and a gas such as nitrogen gas is supplied to the space between the bottom surface of the wafer W and the opposed surface of the spin base 5 from the gas discharge outlet 61. The gas discharge outlet 61 links to a gas supply source 67 via an on-off valve 63 and a flow volume regulating valve 65 which open and close under the control of the controller 17.

Figure 2A:
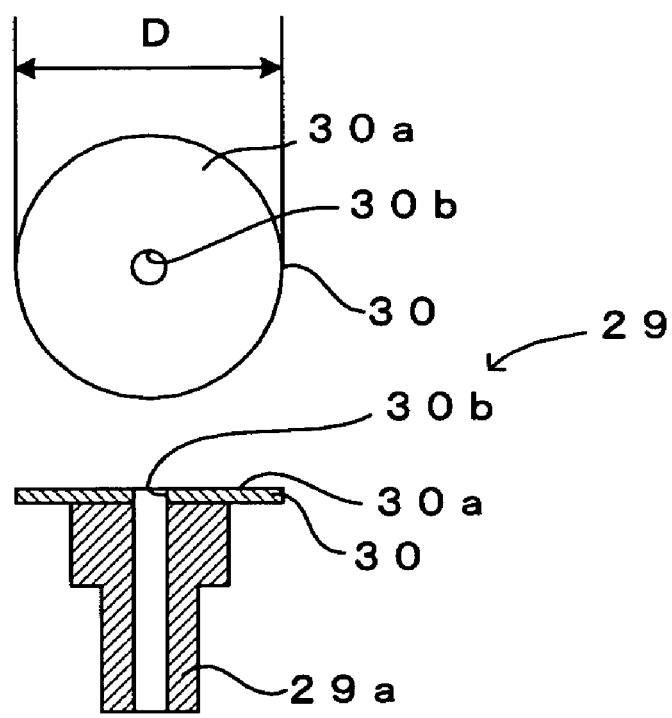
FIGS. 2A and 2B are drawings which show an upper end portion of a lower cleaning nozzle.
Figure 2B:
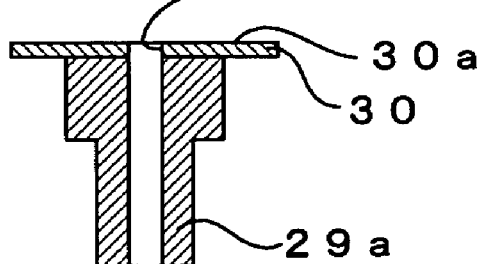

FIGS. 2A and 2B are drawings which show an upper end portion of the lower cleaning nozzle, of which FIG. 2A is a plan view and FIG. 2B is a cross sectional view. In a top end portion of the lower cleaning nozzle 29, a blocking member 30 shaped like a flat plate is attached to the tip of a nozzle main body 29a and the top surface 30a of the blocking member 30 is opposed against and parallel to the bottom surface of the wafer W which is supported at the support pins 7. An outlet 30b is formed approximately at the center of the blocking member 30, making it possible to eject the processing liquid such as the chemical solution and the rinsing liquid toward the bottom surface of the wafer W via the outlet 30b. Meanwhile, a ring-like portion surrounding the outlet 30b covers a section above the gas discharge outlet 61. Due to this, a gas discharged from the gas discharge outlet 61 is fed to the space between the bottom surface of the wafer W and the opposed surface of the spin base 5 from the gap between the bottom surface of the blocking member 30 and the opposed surface of the spin base 5. The plan size D of the blocking member 30 may be any desired size. As described above, the plan size D may be a size which is enough to cover the gas discharge outlet 61, or alternatively, the plan size D may be larger than that for coverage of a fastening component which is fastened with link portions of the rotation shaft 1 and the spin base 5 for the purpose of linking these two. To cover the fastening component in this manner, the plan size D may be 50 mm or larger for example, which effectively prevents entry of a chemical solution, a rinsing liquid to a section of the fastening component, e.g., a thread groove. Further, the larger the plan size D becomes, the larger a puddle becomes, and a longer time becomes necessary for removal of drops from a bottom central region of the wafer W and the lower cleaning nozzle 29 as described later. There arises another problem of interference with a wafer transportation mechanism during transportation of the wafer W. Hence, considering these, it is desirable to set the plan size D to 120 mm or smaller for instance.

The feed/suction mechanism 33 will now be described with reference to FIG. 3. FIG. 3 is a block diagram which schematically shows the structure of the feed/suction mechanism. The feed/suction mechanism 33 has two major functions, namely, (1) the function of supplying a chemical solution and a rinsing liquid to the lower cleaning nozzle 29 and (2) the function of sucking and accordingly removing via the lower cleaning nozzle 29 a puddle which is formed between the bottom central region of the wafer W and the blocking member 30 in the manner described below.

First, the supplying function will be described. In the feed/suction mechanism 33, a processing liquid supply section 43 which guides chemical solutions from chemical solution supply sources and DIW from DIW supply sources from the lower cleaning nozzle 29 is disposed as the "supplier" of the invention. One end of the processing liquid supply section 43 is connected with a rear end portion of the lower cleaning nozzle 29, and the other end of the processing liquid supply section 43 is connected with a suction pipe 82 via an on-off valve 81. One end of a pipe 31 in which an on-off valve 51 is inserted is connected with the other end of the processing liquid supply section 43 which is located on the nozzle side relative to the on-off valve 81. The other end of the pipe 31 is connected with a first DIW supply source 35.

A pressure controller 37 which adjusts the flow volume of DIW from the first DIW supply source 35 is disposed to the pipe 31. On the downstream side relative to the pressure adjustor 37, the pipe 31 seats a flowmeter 39 which measures the supply volume of DIW supplied from the first DIW supply source 35. The controller 17 calculates a difference between the supply volume measured with the flowmeter 39 and a preset supply volume (a first supply volume SV1), and an electropneumatic convertor 41 adjusts the air pressure to the pressure controller 37 in accordance with a command voltage which is based on this difference.

The processing liquid supply section 43 is further connected with three introduction valves 45, 47 and 49 which serve as on-off valves and flow volume regulating valves so that it is possible to independently adjust the volumes of introducing the respective fluids to the processing liquid supply section 43 from one end side connected with the lower cleaning nozzle 29 (nozzle side) to the other end side. The first introduction valve 45 links to a first chemical solution supply source 53 and regulates the volume of a first chemical solution introduced to the processing liquid supply section 43. The second introduction valve 47 links to a second chemical solution supply source 55 and regulates the volume of a second chemical solution introduced to the processing liquid supply section 43. The third introduction valve 49 links to a second DIW supply source 57 and regulates the volume of DIW introduced to the processing liquid supply section 43. The first chemical solution and the second chemical solution may be etchants and may be different from each other. The controller 17 controls opening and closing of all of the on-off valves 51, 81 and the introduction valves 45, 47 and 49.

In this structure, in chemical processing for the bottom surface of the wafer W, the controller 17 adjusts the introduction valves 45 and 47 and ensures introduction of the first or the second chemical solution in a required volume to the processing liquid supply section 43. That is, with the introduction valves 47, 49 and the on-off valve 51 close but the introduction valve 45 is open, it is possible to introduce the first chemical solution to the processing liquid supply section 43. Meanwhile, with the introduction valves 45, 49 and the on-off valve 51 close but the introduction valve 47 is open, it is possible to introduce the second chemical solution to the processing liquid supply section 43. In rinsing for the bottom surface of the wafer W, the controller 17 opens the on-off valve 51 and adjusts the pressure controller 37 via the electropneumatic convertor 41, thereby introducing DIW that supply volume is set to the first supply volume SV1 from the first DIW supply source 35 to the processing liquid supply section 43, and adjusts the introduction valve 49, thereby introducing DIW that supply volume is set to a second supply volume SV2, which is less than the first supply volume SV1 from a second DIW supply source 57 to the processing liquid supply section 43. In consequence, a large volume of DIW which is the total of the first supply volume SV1 and the second supply volume SV2 is supplied to the bottom surface of the wafer W.

The suction function will now be described. As described above, the other end of the processing liquid supply section 43 is connected with one end of the suction pipe 82 (which corresponds to the "suction channel" of the invention) via the on-off valve 81. A diffuser type convum 83 functioning as the "suction device" of the invention is connected with the other end of the suction pipe 82. The convum 83 is connected with a compressed air supply source not shown (a pressure air pipe, a compressor and the like installed within a factory), and a negative pressure is generated inside the suction pipe 82 as compressed air is fed to the convum 83 from the compressed air supply source, which realizes suction. When the on-off valve 81 is opened while the convum 83 is operating but the supply of the chemical solutions and DIW is stopped, not only liquid components inside the lower cleaning nozzle 29 and the processing liquid supply section 43 but a puddle formed in the manner described later are sucked and removed. The liquids thus sucked by the convum 83 are discharged to a drain which is disposed on the downstream side relative to the convum 83. The "suction device" is not limited to a convum but may be an aspirator, a vacuum pump, etc.

The suction pipe 82 is formed by a main pipe 82*a* (which corresponds to the "main channel" of the invention) and two branch pipes 82*b* and 82*c* extending from the main pipe 82*a* (which correspond to the "branch channels" of the invention). A needle valve 84 is interposed in the main pipe 82*a* while a needle valve 85 is interposed in one branch pipe 82*b*, for the purpose of setting the speed of sucking a puddle. The needle valves 84 and 85 are valves which regulate the flow volumes of fluids which flow inside the suction pipe 82. The needle valve 84 is set so as to adjust the flow volume inside the main pipe 82*a* to a first flow volume FV1, whereas the needle valve 85 is set so as to adjust the flow volume inside the branch pipe 82*b* to a second flow volume FV2 which is smaller than the first flow volume FV1. Meanwhile, an on-off valve (air valve) 86 which can be opened and closed under the control of the controller 17 is inserted in the other branch pipe 82*c*. In this embodiment, the needle valves 84 and 85 thus function respectively as the "first flow volume regulating valve" and the "second flow volume regulating valve" of the invention.

In this structure, it is possible to set the speed of sucking a puddle over two stages as the on-off valve 86 opens and closes. That is, as the convum 83 operates with the on-off valve 86 closed, a puddle is sucked through the needle valve 84 and the needle valve 85. Since the needle valve 85 is adjusted to the second flow volume FV2 which is smaller than the first flow volume FV1, the speed of sucking a puddle is set to a first speed V1 which is regulated by the needle valve 85 and relatively slow. On the contrary, when the on-off valve 86 opens while the convum 83 operates, a puddle is sucked through the needle valve 84 and the branch pipe 82*c* in which the opened on-off valve 86 is interposed. In other words, the speed of sucking a puddle is set to a second speed V2 which regulated by the needle valve 84 and is faster than the first speed V1.

Figure 4:
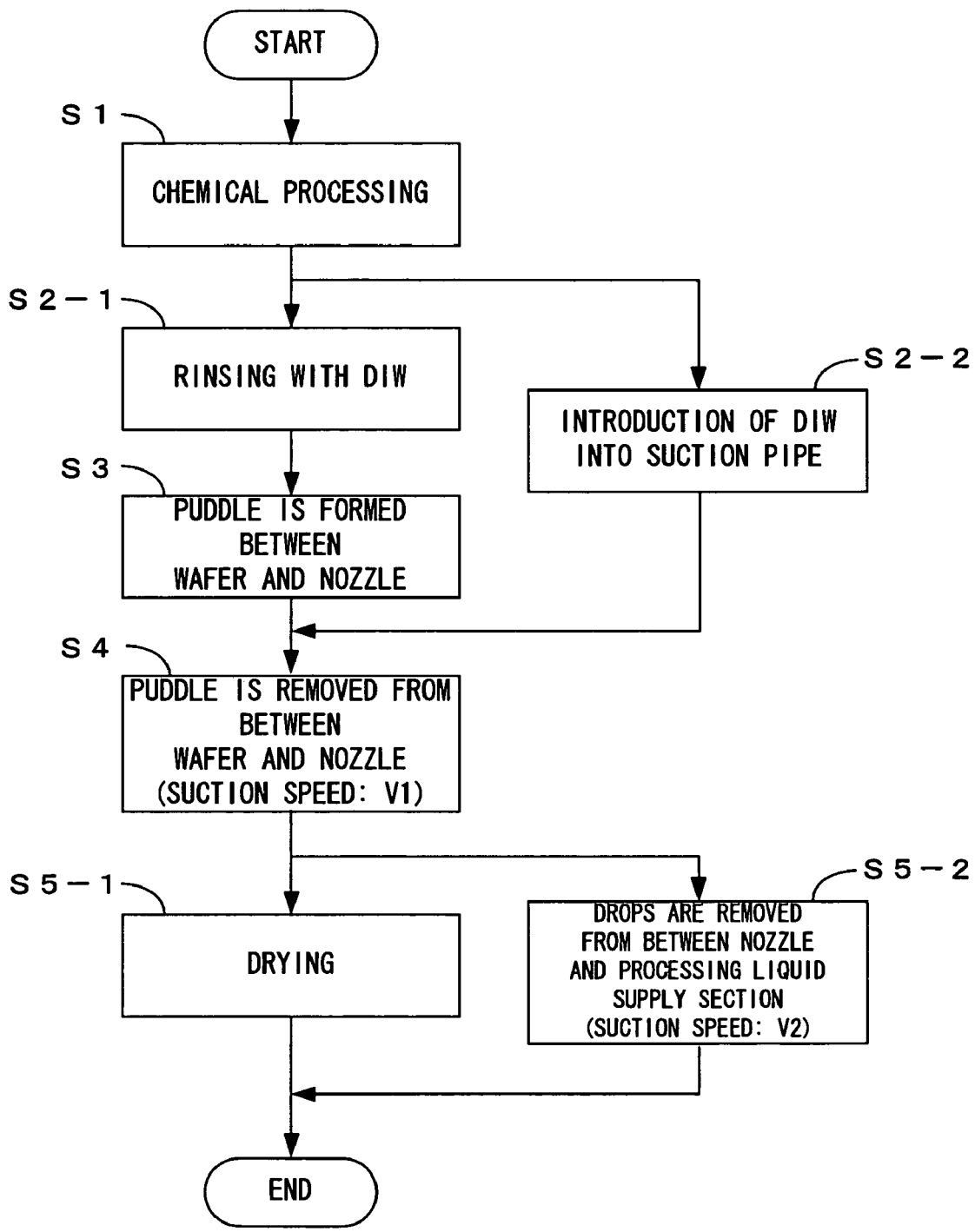
FIG. 4 is a flow chart which shows an operation of the substrate processing apparatus which is shown in FIG. 1.

An operation of the substrate processing apparatus having this structure will now be described with reference to FIGS. 4 through 7. FIG. 4 is a flow chart which shows the operation of the substrate processing apparatus which is shown in FIG. 1. FIGS. 5A through 7C are drawings which schematically show the operation of the substrate processing apparatus which is shown in FIG. 1. More specifically, FIGS. 5A through 7C show the operation for processing the bottom surface of the wafer W. In the case of this substrate processing apparatus, a substrate transportation robot not shown transports an unprocessed wafer W to the substrate processing apparatus, and as the wafer W is placed on the support pins 7, the controller 17 controls the respective parts of the apparatus as described below, thereby executing chemical processing, rinsing, puddle forming processing, puddle removing processing and drying. For the substrate transportation robot to transport the wafer W, the atmosphere blocking member 9, the support shaft 11 and the upper cleaning nozzle 12 are retracted as one unit to above the spin base 5. In addition, the introduction valves 45, 47 and 49 and the on-off valves 51, 81 and 86 are all close.

As the wafer W is set on the support pins 7 as described above, the atmosphere blocking member 9, the support shaft 11 and the upper cleaning nozzle 12 descend as one unit, and the atmosphere blocking member 9 is positioned in the vicinity of the wafer W. Following this, the motor 3 operates and the wafer W accordingly rotates at a first number of revolution. At this stage, driven by the motor of the block drive mechanism not shown, the atmosphere blocking member 9 rotates together with the support shaft 11 about the vertical axis J. Simultaneously with the start of rotations of the wafer W at the first number of revolution, as shown in FIG. 5A, the controller 17 opens the introduction valve 45 so that a predetermined volume of the chemical solution is introduced to the processing liquid supply section 43 from the first chemical solution supply source 53, the first chemical solution is supplied to the bottom surface of the wafer W from the outlet 30b of the lower cleaning nozzle 29 and the bottom surface of the wafer W is chemically processed with the chemical solution (Step S1). When the first chemical solution is an etchant, bevel etching may be carried out which is etching with the first chemical solution flowing around to a rim region of the top surface of the wafer W.

The first chemical solution reaching the circumferential edge of the wafer W is drained off to the side due to centrifugal force developing at the rotating wafer W and collected through a collection port not shown. After the processing of the wafer W with the first chemical solution for a certain period of time, the introduction valve 45 closes under the control of the controller 17 and discharge of the first chemical solution is stopped. Depending upon the type of the wafer W to be processed, the bottom surface of the wafer W is processed with the second chemical solution instead of using the first chemical solution, in which case the second chemical solution is collected through a collection port than the one for collection of the first chemical solution.

Following this, the controller 17 executes rinsing using DIW as a rinsing liquid (Step S2-1; first step). In other words, the controller 17 opens the on-off valve 51 while the wafer W keeps rotating, whereby DIW regulated to the first supply volume SV1 by the pressure controller 37 via the electropneumatic convertor 41 is introduced to the processing liquid supply section 43 from the first DIW supply source 35 and DIW regulated to the second supply volume SV2 by the introduction valve 49 is introduced to the processing liquid supply section 43 from the second DIW supply source 57 (FIG. 5B). In consequence, a large volume of DIW which is the total of the first supply volume SV1 and the second supply volume SV2 is supplied to the bottom surface of the wafer W from the lower cleaning nozzle 29, which attains cleaning with DIW, namely, pre-rinsing of the bottom surface of the wafer W thus exposed to the chemical solutions. At this stage, the blocking member 30 of the lower cleaning nozzle 29 and the opposed surface of the spin base 5 still partially drops of the chemical solutions.

In parallel to the pre-rinsing of the bottom surface of the wafer W with DIW, the controller 17 opens the on-off valve 13 and initiates supply of DIW to the top surface of the wafer W via the upper cleaning nozzle 12 from the processing liquid supply source 15, thereby forming a DIW protection layer on the top surface of the wafer W. While leaving the protection layer as it is, the controller 17 opens the on-off valve 25 and starts supply of DIW from the DIW supply source 27 via the side cleaning nozzle 23 to the space which is between the atmosphere blocking member 9 and the top surface of the wafer W. This achieves cleaning of the atmosphere blocking member 9 while protecting the top surface of the wafer W.

The controller 17 then makes the side cleaning nozzle 23 move down to between the wafer W and the spin base 5. This stops supply of DIW to the atmosphere blocking member 9 and dries the atmosphere blocking member 9. Meanwhile, the destination of DIW supplied from the side cleaning nozzle 23 changes to the space which is formed between the bottom surface of the wafer W and the opposed surface of the spin base 5, and the support pins 7 and the opposed surface of the spin base 5 located inside this space are cleaned.

Further, the controller 17 rotates the wafer W again at the first number of revolution and opens the introduction valve 49 and the on-off valve 51, thereby supplying a large volume of DIW as the rinsing liquid from the lower cleaning nozzle 29 to the bottom surface of the wafer W which rotates at a high speed. As a result, the bottom surface of the wafer W is cleaned with DIW again in a similar manner to that of the pre-rinsing described above. The controller 17 then opens the on-off valve 13 and initiates supply of DIW to the top surface of the wafer W via the upper cleaning nozzle 12 from the processing liquid supply source 15. DIW is supplied to the entire wafer W in this fashion, which attains last rinsing.

As shown in FIG. 5C, during the rinsing described above, the controller 17 activates the convum 83, thereby generating a negative pressure inside the suction pipe 82, and opens the on-off valve 81, thereby guiding a part of DIW supplied to the processing liquid supply section 43 into inside the suction pipe 82 (Step S2-2). The gas (air) filling up the suction pipe 82 is consequently replaced with the liquid (DIW). To be more precise, during the previous processing of the wafer W, the suction pipe 82 has been filled up with the gas as a result of suction over a sufficiently long period of time which would not leave drops on the lower cleaning nozzle 29 or the processing liquid supply section 43, through a puddle sucking operation described later. As a part of DIW supplied to the processing liquid supply section 43 is guided into inside the suction pipe 82, the suction pipe 82 is filled up with DIW instead of the gas. As the inside of the suction pipe 82, namely, the insides of the main pipe 82a and the branch pipes 82b, 83c are thus occupied with DIW, the controller 17 closes the on-off valve 81. The effect of filling up inside of the suction pipe 82 with DIW will be described later.

While the wafer W is drained off of much of the rinsing liquid as the wafer W is rinsed while rotating, the rinsing liquid will partially remain in the form of drops at the bottom surface of the wafer W and the top end portion of the lower cleaning nozzle 29. Further, since centrifugal force developing due to rotations of the substrate acts differently upon the bottom central region of the wafer and the rim region of the bottom surface of the wafer, relatively large drops will adhere to the bottom central region of the wafer. Only relatively modest centrifugal force acts upon these drops, and hence, relatively large ones among residual drops will stay at the bottom central region of the wafer W and/or the top end portion of the lower cleaning nozzle 29. These residual drops L will be one of the factors of causing a watermark or a particle.

There also are the drops L remaining inside the lower cleaning nozzle 29 and/or the processing liquid supply section 43. In the event that there are the drops L remaining inside the lower cleaning nozzle 29 and/or the processing liquid supply section 43, when the chemical solution is discharged at the lower cleaning nozzle 29 via the processing liquid supply section 43 for chemical processing of the next wafer W, the drops of the rinsing liquid as well are discharged together with the chemical solution. Collection of these drops therefore changes the concentration of the chemical solution and eventually changes the etching rate. Despite the need to collect the chemical solution alone and reduce a running cost, it is not possible to collect the chemical solution from the beginning, which decreases the rate of chemical solution collection (FIG. 6A).

Noting this, these drops L are removed through the puddle forming processing (second step) and the puddle removing processing (third step). Describing in more specific details, at Step S3, the controller 17 sets the flow volume of DIW which serves as the "second processing liquid" and the "nozzle cleaning liquid" of the invention and the number of revolution of the wafer to those appropriate for formation of a puddle. The flow volume of DIW and the number of revolution may be set as follows for instance.

The flow volume of DIW: 1000 cm$^3$/min or less

The number of wafer revolution: 200 rpm or less

More preferably, the flow volume of DIW and the number of revolution may be set as described below.

The flow volume of DIW: 400 $cm^3$/min or less

The number of wafer revolution: 0 through 50 rpm

DIW regulated under these conditions to such a flow volume by means of the introduction valve 49 is fed to the processing liquid supply section 43 from the second DIW supply source 57 and discharged at the outlet 30b of the lower cleaning nozzle 29 toward the bottom surface of the wafer W. Further, with the motor 3 rotating under control and the number of revolution of the wafer W accordingly set to a number of revolution which is proper for formation of a puddle, a puddle P of the nozzle cleaning liquid (DIW) is formed between the bottom surface of the wafer W and the entire top surface 30a of the blocking member 30 (Step S3).

As the flow volume of the nozzle cleaning liquid and the number of revolution of the wafer are set in this manner, the puddle P (FIG. 6B) is formed, and immediately after rinsing (first step), the drops L remaining at the bottom central region of the wafer W and the top end portion of the lower cleaning nozzle 29 are merged with the puddle P DIW is supplied to the entire top surface 30a of the blocking member 30 as the nozzle cleaning liquid, and the nozzle is cleaned without fail. The nozzle may be cleaned under these conditions for a certain period of time even after formation of the puddle P, or alternatively, the next puddle removal may be performed immediately after formation of the puddle P.

At the next step S4, the controller 17 closes the introduction valve 49 and stops supply of DIW to the lower cleaning nozzle 29, and in the condition that the supply is stopped, the controller 17 opens the on-off valve 81 while keeping the on-off valve 86 closed (FIG. 6C). As a result, the liquid components and the puddle P staying the lower cleaning nozzle 29 and/or inside the processing liquid supply section 43 are sucked at the outlet 30b via the main pipe 82a which seats the needle valve 84 and the branch pipe 82b which seats the needle valve 85, which attains removal of the puddle P existing between the bottom central region of the wafer W and the entire top surface 30a of the blocking member 30. Since the needle valve 85 is adjusted to the second flow volume FV2 which is smaller than the first flow volume FV1, the needle valve 85 regulates the speed of sucking the puddle P and the puddle P is sucked at the first speed V1 which is a relatively slow speed.

If the suction speed is set at a fast speed, some part of the puddle P may separate away and some other part of the puddle P may stay while the puddle P is being sucked, and hence, it is desirable to set the first speed V1 considering the liquid components of the puddle P. That is, if the speed of sucking the puddle P is too fast, during this operation of sucking the liquid as a chunk of drops utilizing the surface tension of the liquid (the cohesive force of the liquid), the suction speed which brings suction force which exceeds the surface tension of the liquid will knock down the puddle P existing as a chunk of drops and the drops will stay at the bottom surface of the wafer W and/or the lower cleaning nozzle 29. In light of this, the speed of sucking the puddle P during the first half of the suction, that is, the first speed needs be such a suction speed which brings suction force which is equal to or smaller than the surface tension of the liquid. A suction speed which makes the surface tension of the liquid approximately the same as suction force varies depending upon various factors such as the film type on the wafer W, the material of the blocking member 30, the plan size D of the blocking member 30 and the types of the rinsing liquid (first processing liquid) and the nozzle cleaning liquid (second processing liquid), and can be calculated based on an experiment or from numerical analysis based on these factors.

Further, in this embodiment, since the suction pipe 82 is filled up with DIW during rinsing, it is possible to attain stable suction at a low speed during an initial suction stage for the following reason. If there is a gas inside the suction pipe 82, the gas inside the suction pipe 82 will get compressed and the volume of the gas will change as soon as the on-off valve 81 opens and the puddle P will get sucked rapidly. This will make the speed of sucking the puddle P too fast at the start of the suction and permit drops remain at the bottom surface of the wafer W and/or the top surface 30a of the blocking member 30. However, in this embodiment, the suction pipe 82 is filled up with a liquid (DIW) at the start of the suction and unlike a gas, the liquid inside the suction pipe 82 will hardly change its volume due to compression. This ensures that the puddle P will not get sucked rapidly during the initial suction stage, but instead allows suction of the puddle P at a stably low suction speed. It is thus possible to obviate separation of the puddle P and prevent a separated part of the puddle P from staying as drops at the bottom surface of the wafer W and/or the top surface 30a of the blocking member 30.

Figure 8:
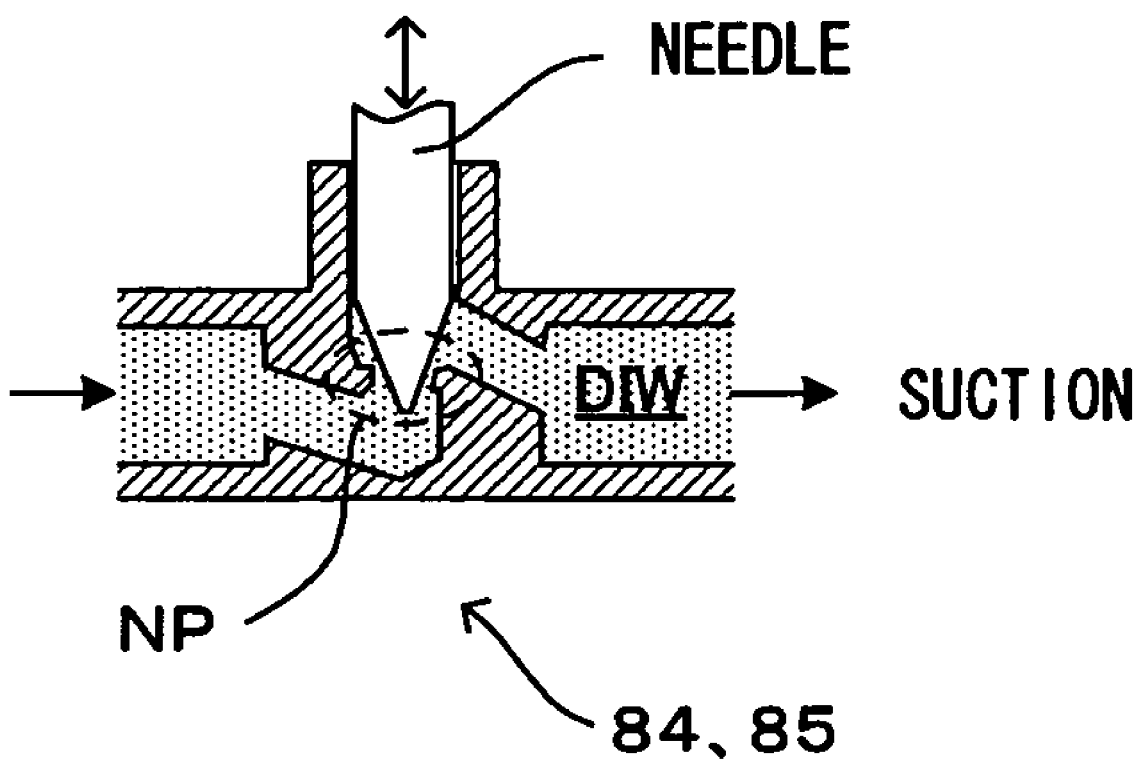
FIG. 8 is a drawing which shows an example of the structure of a needle valve.

Further, in this embodiment, the speed of sucking the puddle P is set through adjustment of the flow volumes of the fluids flowing inside the suction pipe 82 using the needle valves 84 and 85. If a mixture of a liquid and a gas flows through needle portions of the needle valves 84 and 85, namely, portions which regulate the flow volumes by narrowing flow paths for the fluids, the speed of sucking the puddle will vary and become unstable. In this embodiment however, the suction pipe 82 is filled up with DIW during rinsing and therefore at the start of the suction, the needle portions NP (fluid pass-through portions) of the needle valves 84 and 85 are filled up with the liquid (DIW) as shown in FIG. 8. Since the fluids which flow through the needle valves 84 and 85 contain only the liquid during the initial suction stage, a mixture of a gas and the liquid (drops) will never flow through the needle portions NP and the speed of sucking the puddle P will never vary. It is therefore possible to stabilize the speed of sucking the puddle P during the initial suction stage.

In this manner, the puddle P is sucked at a stable and slow suction speed (the first speed V1) during the initial stage of the suction/removal, and hence, it is possible to securely obviate separation of the puddle P and prevent a separated part of the puddle P from staying at the bottom surface of the wafer W and/or the top surface 30a of the blocking member 30.

Following this, the puddle P is sucked from between the bottom surface of the wafer W and the top surface 30a of the blocking member 30 and collected into inside the nozzle main body 29a. An inert gas regulated to an appropriate flow volume by means of the on-off valve 19 shown in FIG. 1 is then supplied from the gas supply source 21 toward the top surface of the wafer W via the gas supply path 18. Further, with the on-off valve 63 opened, an inert gas regulated to an appropriate flow volume by means of the on-off valve 65 is supplied at the gas discharge outlet 61 from the gas supply source 67 toward the bottom surface of the wafer W via the gas supply path 59. The number of revolution of the motor 3 is then raised to a faster level from the first number of revolution. In consequence, the inert gases are fed to the top and the bottom surfaces of the wafer W while the wafer W rotates faster than at the first number of revolution, which dries the wafer W (Step S5-1).

As the puddle P is sucked from between the bottom surface of the wafer W and the top surface 30a of the blocking member 30 and collected into inside the nozzle main body 29a, the controller 17 opens the on-off valve 86. The puddle thus collected into inside the nozzle main body 29a is sucked through the needle valve 84 and the branch pipe 82c in which the opened on-off valve 86 is interposed (Step S5-2). In other words, the speed of sucking the puddle P is set to the second speed V2 which is regulated by the needle valve 84 and is faster than the first speed V1 (FIG. 7A). Since separation of the puddle P needs not be considered with respect to suction through inside the nozzle pipe, the suction speed may be raised from the middle of the processing to thereby shorten the time required for the suction and improve the throughput. The suction continues at this faster speed (the second speed V2) since then (FIG. 7B). The controller 17 closes the on-off valve 81 after a predetermined period of time and stops suction via the outlet 30b.

As the suction speed is accelerated during the latter half of the suction, it is possible to complete the suction during drying of the wafer W. Upon the drying at Step S5-1, the controller 17 instructs the motor 3 to stop driving and stops rotations of the wafer W (FIG. 7C). This completes the series of processing, i.e., cleaning, rinsing, puddle forming processing, puddle removing processing and drying.

As described above, in this embodiment, DIW is supplied to the suction pipe 82 during rinsing, and therefore, the suction pipe 82 is already filled with the liquid (DIW) at the start of suction of the puddle P. Since a liquid will hardly change its volume due to compression unlike a gas, the puddle P will not get sucked rapidly during the initial suction stage. This stabilizes the speed of sucking the puddle P during the initial suction stage.

Further, since the needle portions NP (fluid pass-through portions) of the needle valves 84 and 85 are filled up with the liquid (DIW) during rinsing, the fluids flowing through the needle valves 84 and 85 contain only the liquid during the initial suction stage. Due to this, a mixture of a gas and the liquid (drops) will never flow through the needle portions NP and the speed of sucking the puddle P will never vary. It is therefore possible to stabilize the speed of sucking the puddle P during the initial suction stage.

Since it is possible to stabilize the speed of sucking the puddle P during the initial suction stage, it is possible to prevent drops of the rinsing liquid from remaining at the lower cleaning nozzle 29 and the processing liquid supply section 43. This prevents drops of the rinsing liquid from getting discharged at chemical solution ejection, enhances the rate of chemical solution collection and reduces the amount of consumed chemical solutions. In addition, as drops are prevented from staying near the lower cleaning nozzle 29, it is possible to effectively suppress generation of a watermark, adhesion of a particle and the like during spin drying.

Further, in this embodiment, the puddle P is sucked while the speed of sucking the puddle P is accelerated over two stages from the first speed V1 to the second speed V2 which is faster than the first speed V1. During the initial suction stage, a puddle formed between the bottom surface of the wafer W and the top surface 30a of the blocking member 30 is sucked relatively slowly from the stationary state, which prevents separation of the puddle. As the puddle is sucked while the suction speed is accelerated from the middle of the suction, it is possible to improve the throughput of the apparatus.

To be noted in particular, in this embodiment, after removal at the first speed V1 of the puddle P from between the bottom surface of the wafer W and the top surface 30a of the blocking member 30 via the outlet 30b, the suction speed is raised from the first speed V1 to the second speed V2 for suction of the puddle P which has been collected into inside the nozzle main body 29a. It is therefore possible to shorten the time required for removal of the puddle and improve the throughput while securely preventing drops from staying at the bottom surface of the wafer W and the top surface 30a of the blocking member 30. In short, slow suction until removal of the puddle P from between the bottom surface of the wafer W and the top surface 30a of the blocking member 30 avoids separation of the puddle and securely prevents drops from staying at the bottom surface of the wafer W or the top surface 30a of the blocking member 30. After collection of the puddle into inside the nozzle, the suction speed is raised to the extent that separation of the puddle will not be a problem, which makes it possible to finish the suction during spin drying and improve the throughput of the apparatus.

Since it is possible to complete the suction during spin drying and set the speed of sucking the puddle P to a slow speed during the initial suction stage, it is possible to prevent drops of the rinsing liquid from remaining at the lower cleaning nozzle 29 and the processing liquid supply section 43. This prevents drops of the rinsing liquid from getting discharged at chemical solution ejection, enhances the rate of chemical solution collection and reduces the amount of consumed chemical solutions. In addition, as drops are prevented from staying in the vicinity of the lower cleaning nozzle 29, it is possible to effectively suppress generation of a watermark, adhesion of a particle and the like during spin drying.

In terms of throughput, this embodiment promises the following effect. That is, the conventional apparatus with which it is difficult to maintain the speed of sucking drops constant requires setting the suction time specified in a recipe rather long in an attempt to prevent drops from remaining at the nozzle and the processing liquid supply section. This is because the conventional apparatus has no other choice but to setting the flow volume regulating valves to attain a slower suction speed considering a probably inevitable change of the suction speed and to eventually prevent drops from staying. For suction of all drops adhering to the nozzle and the inside of the processing liquid supply section therefore, the suction time must be set long. On the contrary, since this embodiment attains stabilization of the suction speed, the suction speed may be set to a relatively high speed to the extent permitting drops to stay. It is thus acceptable to set the suction time short, and this embodiment is accordingly very effective in improving the throughput.

Further, in this embodiment, a puddle is sucked via the needle valves 84 and 85 when the on-off valve 86 is close, and a puddle is sucked via only the needle valve 84 when the on-off valve 86 is open. Since the needle valve 85 is adjusted to allow a fluid to flow at a smaller flow volume than the needle valve 84 does, as the on-off valve 86 is switched, the speed of sucking a puddle is easily accelerated over the two stages. In other words, although the suction speed attained by the suction device such as the convum 83 can be set to only one speed as an initial speed using merely the needle valve alone, it is possible according to this embodiment to easily and quickly accelerate the suction speed over the two stages only by means of switching of the on-off valve 86. Moreover, when the flow volumes of fluids which are permitted through the two needle valves 84 and 85 are each regulated, it is possible to freely set each of two stages of the suction speed to any desired speed.

The invention is not limited to the embodiment above but may be modified to the extent not deviating from the intention of the invention. For instance, although the embodiment above requires accelerating the speed of sucking a puddle over the two stages from the first speed V1 to the second speed V2 which is faster than the first speed V1, acceleration of the suction speed is not limited to this. The suction speed may be accelerated over multiple stages from the first speed V1 to faster speeds including the second speed V2 step by step or accelerated continuously from the first speed V1 to faster speeds including the second speed V2.

Figure 9:
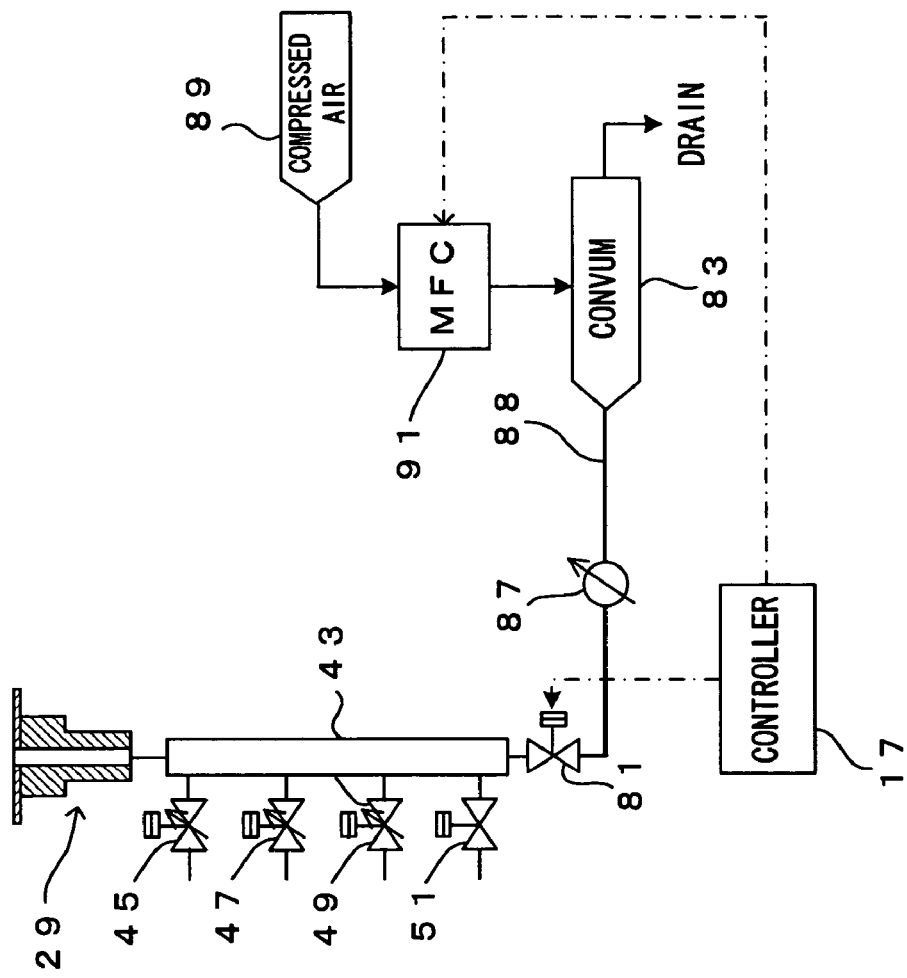
FIG. 9 is a drawing of a substrate processing apparatus according to other embodiment of the invention.

Further, in the embodiment above, when the on-off valve 86 is open, a puddle is sucked via both the needle valve 84, which is adjusted to allow a fluid to flow at the first flow volume FV1, and the needle valve 85 which is adjusted to allow a fluid to flow at the second flow volume FV2 which is smaller than the first flow volume FV1, whereas when the on-off valve 86 is close, a puddle is sucked via only the needle valve 84. That is, although the embodiment above requires that the speed of sucking a puddle is accelerated over the two stages as the on-off valve 86 is switched using the two needle valves 84 and 85 that flow volume of fluids capable to pass is different each other, the method of accelerating the suction speed is not limited this. For instance, as shown in FIG. 9, a needle 87 which is adjusted to allow a fluid to flow at a predetermined flow volume may be interposed in one suction pipe 88 which links the processing liquid supply section 43 with the convum 83 and the suction force of the convum 83 may be varied, to thereby accelerate the suction speed. To change the suction force of the convum 83, a flow volume regulator such as an MFC (mass flow controller) 91 may be inserted between the convum 83 and a compressed air supply source 89 (a pressure air pipe, a compressor and the like installed within a factory) and the MFC 91 may control the flow volume of compressed air fed to the convum 83 for example. This permits changing the suction force of the convum 83 and accelerating the speed of sucking a puddle in any desired fashion may it be over stages or continuously.

Further, although the embodiment above requires supplying the first processing liquid to the suction pipe 82 during rinsing (first step) with the first processing liquid and filling up the suction pipe 82 with a liquid (the first processing liquid), the second processing liquid may be supplied to the suction pipe 82 during puddle formation (second step) with the second processing liquid and filling up the suction pipe 82 with a liquid (the second processing liquid). The only requirement in this respect is to fill up the suction pipe 82 with a liquid at the start of the suction.

Further, although the embodiment above requires using DIW as the first processing liquid and the second processing liquid and supplying DIW to the suction pipe 82 to fill up the suction pipe 82 with DIW, the types of the first processing liquid and the second processing liquid may be any desired types. While the second processing liquid used for puddle formation therefore needs not consist of the same components as the first processing liquid, to merge the residual drops L with the puddle P without fail, it is desirable to use a liquid which is compatible with the rinsing liquid (the first processing liquid) adhering as a result of rinsing to the bottom surface of the wafer W and the top end portion of the nozzle, and for this reason, the embodiment above uses the same rinsing liquid as the second processing liquid. This attains merger of the residual drops L and favorable formation of the puddle P. In addition, since it is not necessary to use different types of liquids as a liquid for rinsing, a liquid for puddle formation and a liquid for filling up the suction pipe 82, it is possible to smoothly introduce the liquids, improve the throughput and implement simple control. Since the rinsing liquid attains another effect of cleaning the nozzle, the pipes and the like, cleaning of the nozzle, the pipes and the like is performed at the same time as removal of the residual drops L in the embodiment above. It is therefore possible to execute the series of substrate processing, all the way from cleaning to drying, in an excellent manner while maintaining the nozzle, the pipes and the like clean and preventing slowing down of the throughput.

The embodiment above is directed to an application of the invention to a substrate processing apparatus in which a nozzle comprising at its top end portion an opposed surface (the top surface 30a of the blocking member 30) facing the bottom surface of a wafer W, i.e., a nozzle of the so-called umbrella type discharges a wafer cleaning liquid, a rinsing liquid, a nozzle cleaning liquid and the like toward a bottom central region of the wafer W. The invention is not limited to this application but may be applied to a substrate processing apparatus which comprises any desired type of nozzle. For example, although the top surface of the blocking member is opposed against and parallel to the bottom surface of a wafer in the embodiment above, the top surface of the blocking member may be slanted downward like a mortar toward the outlet which is formed approximately at the center. This realizes smooth removal of a puddle by suction.

Further, although the embodiment above requires forming the puddle P after rinsing and removing the puddle P by suction, formation of the puddle P is not indispensable. Drops of the rinsing liquid still adhering to the nozzle and/or the processing liquid supply section (the supplier) connected with the nozzle after rinsing may be sucked. In this instance as well, as a part of the rinsing liquid (the first processing liquid) supplied to the processing liquid supply section is introduced into the suction pipe 82 during rinsing, the suction pipe 82 becomes filled up with a liquid (the first processing liquid) at the start of suction of drops. This stabilizes the speed of sucking drops during an initial suction stage and prevents drops from staying at the nozzle and the processing liquid supply section.

Further, the following effect is attained as suction of drops of the rinsing liquid adhering to the nozzle and/or the processing liquid supply section takes place with the suction speed set to the first speed V1 which is relatively slow and then accelerated over at least two stages from the first speed V1 to the second speed V2 which is relatively fast during suction of drops of the rinsing liquid adhering to the nozzle and/or the processing liquid supply section (the supplier) after rinsing. That is, during an initial suction stage which is supposed to see a large volume of sucked drops, drops are sucked relatively slowly, thereby preventing drops from remaining not sucked at the nozzle and the processing liquid supply section. From the middle of the suction, the suction speed is raised and drops are sucked, thereby shortening the time required for removal of drops and improving the throughput of the apparatus.

The embodiment above is directed to an application of the invention to a substrate processing apparatus which cleans the top and the bottom surfaces of a wafer W which is one type of substrates. The invention is not limited to this application but may be applied generally to any substrate processing apparatus in which the first processing liquid is discharged from a nozzle to a substrate and rinsing is performed with the first processing liquid, including a substrate processing apparatus in which a nozzle is disposed over a distance from the bottom surface of a substrate, the first processing liquid is discharged from the nozzle toward the bottom surface of the substrate and rinsing is performed with the first processing liquid, a substrate processing apparatus in which a nozzle is disposed over a distance from the top surface of a substrate, the first processing liquid is discharged from the nozzle toward the top surface of the substrate and rinsing is performed with the first processing liquid and a substrate processing apparatus in which a nozzle is disposed over a distance from a side surface of a substrate, the first processing liquid is discharged from the nozzle toward the top and the bottom surfaces of the substrate and rinsing is performed with the first processing liquid.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing method, comprising:
a rinsing step of supplying a first processing liquid to a nozzle via a supplier connected with said nozzle, discharging said first processing liquid from said nozzle toward a bottom of a substrate and rinsing the bottom of said substrate with said first processing fluid; and
a suction step of sucking drops of said first processing liquid adhering to said nozzle and said supplier via a suction pipe whose one end is connected with said supplier and removing drops of said first processing liquid from said nozzle and said supplier,
wherein a part of said first processing liquid is guided into said suction pipe via said supplier at said rinsing step and said suction pipe is filled up with said first processing liquid,
wherein during said suction step, the drops are sucked at a first speed for a first length of time and sucked at a second, higher speed for a second, subsequent length of time.

2. A substrate processing method, comprising:
a first step of supplying a first processing liquid to a nozzle, which is disposed away from the bottom surface of a substrate, via a supplier connected with said nozzle while rotating said substrate, discharging said first processing liquid from a top end portion of said nozzle toward the bottom surface of said substrate and supplying said first processing liquid to the entire bottom surface of said substrate;
a second step of supplying a second processing liquid to said nozzle via said supplier after said first step, discharging said second processing liquid from said top end portion of said nozzle toward the bottom surface of said substrate and forming a puddle between a bottom central region of said substrate and said top end portion of said nozzle; and
a third step of sucking said puddle from said top end portion of said nozzle via a suction pipe whose one end is connected with said supplier and removing said puddle from between said bottom central region of said substrate and said top end portion of said nozzle,
wherein either a part of said first processing liquid or a part of said second processing liquid is guided into said suction pipe via said supplier at said first step or said second step, respectively, before said third step, and said suction pipe is filled up with said first or second processing liquid,
wherein at said third step, after removal of said puddle from between said bottom central region of said substrate and said top end portion of said nozzle by sucking at said top end portion of said nozzle with a speed of sucking said puddle set to a first speed, the speed of sucking is accelerated and said puddle collected into inside said nozzle is sucked at a second speed which is faster than at least said first speed.

3. The substrate processing method of claim 2, wherein at said second step, a liquid consisting of the same components as those of said first processing liquid is used as said second processing liquid.

4. A substrate processing method, comprising:
a rinsing step of supplying a first processing liquid to a nozzle via a supplier which is connected with said nozzle, discharging said first processing liquid from said nozzle toward a bottom of a substrate and rinsing the bottom of said substrate with said first processing liquid; and
a suction step of sucking drops of said first processing liquid adhering to said nozzle and said supplier along a suction channel whose one end is connected with said supplier and removing drops of said first processing liquid from said nozzle and said supplier,
wherein at said suction step, drops of said first processing liquid are sucked while accelerating a speed of sucking drops of said first processing liquid between two periods of time, the suction occurring at a first speed during a first period of time and the suction occurring at a second, higher speed during a second, subsequent period of time.

5. The substrate processing method of claim 4, wherein said first processing liquid is supplied to said suction channel via said supplier during said rinsing step and said suction channel is filled up with said first processing liquid.

6. A substrate processing method, comprising:
a first step of supplying a first processing liquid to a nozzle, which is disposed away from the bottom surface of a substrate, via a supplier connected with said nozzle while rotating said substrate, discharging said first processing liquid from a top end portion of said nozzle toward the bottom surface of said substrate and supplying said first processing liquid to the bottom entire surface of said substrate;
a second step of supplying a second processing liquid to said nozzle via said supplier after said first step, discharging said second processing liquid from said top end portion of said nozzle toward the bottom surface of said substrate and forming a puddle between a bottom central region of said substrate and said top end portion of said nozzle; and
a third step of sucking said puddle from said top end portion of said nozzle along a suction channel whose one end is connected with said supplier and removing said puddle from between said bottom central region of said substrate and said top end portion of said nozzle,
wherein at said third step, said puddle is sucked while accelerating a speed of sucking said puddle over at least two stages, after removal of said puddle from between said bottom central region of said substrate and said top end portion of said nozzle by sucking at said top end portion of said nozzle with the speed set to a first speed, the speed being accelerated from said first speed to a second speed which is faster than said first speed for suction of said puddle collected into said nozzle.

7. The substrate processing method of claim 6, wherein at said second step, a liquid consisting of the same components as those of said first processing liquid is used as said second processing liquid.

8. The substrate processing method of claim 6, wherein said first processing liquid is supplied to said suction channel via said supplier during said first step, and said suction channel is filled up with said first processing liquid.

9. The substrate processing method of claim 6, wherein said second processing liquid is supplied to said suction channel via said supplier during said second step, and said suction channel is filled up with said second processing liquid.

10. The substrate processing method of claim 1, wherein
at said suction step, drops of said first processing liquid are sucked via said suction pipe whose one end is connected with said supplier via an on-off valve, and
at said rinsing step, said on-off valve is opened to guide said part of said first processing liquid into said suction pipe.

11. The substrate processing method of claim 2, wherein
at said third step, said puddle is sucked via said suction pipe whose one end is connected with said supplier via an on-off valve, and
at said first step or said second step, said on-off valve is opened to guide said part of said first processing liquid or said part of said second processing liquid into said suction pipe.

* * * * *